United States Patent
Houshmand et al.

(10) Patent No.: US 12,282,256 B2
(45) Date of Patent: Apr. 22, 2025

(54) PHOTORESIST DEPOSITION USING INDEPENDENT MULTICHANNEL SHOWERHEAD

(71) Applicant: Applied Materials, Inc., Santa Clara, CA (US)

(72) Inventors: Farzad Houshmand, Mountain View, CA (US); Wayne French, San Jose, CA (US); Anantha Subramani, San Jose, CA (US); Kelvin Chan, San Ramon, CA (US); Lakmal Charidu Kalutarage, San Jose, CA (US); Mark Joseph Saly, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 591 days.

(21) Appl. No.: 17/508,291

(22) Filed: Oct. 22, 2021

(65) Prior Publication Data
US 2022/0155689 A1    May 19, 2022

Related U.S. Application Data

(60) Provisional application No. 63/114,940, filed on Nov. 17, 2020.

(51) Int. Cl.
*G03F 7/16* (2006.01)
(52) U.S. Cl.
CPC .................................... *G03F 7/167* (2013.01)
(58) Field of Classification Search
None
See application file for complete search history.

(56) References Cited

U.S. PATENT DOCUMENTS

| 6,503,331 | B1 | 1/2003 | Yudovsky et al. |
| 7,605,094 | B2 | 10/2009 | Lee et al. |
| 7,780,789 | B2 | 8/2010 | Wu et al. |

(Continued)

FOREIGN PATENT DOCUMENTS

| JP | 2005129712 A | 5/2005 |
| JP | 2017527984 A | 9/2017 |

(Continued)

OTHER PUBLICATIONS

International Preliminary Report on Patentability from PCT/US2021/058317 mailed Jun. 1, 2023, 7 pgs.

(Continued)

*Primary Examiner* — Michael P. Rodriguez
(74) *Attorney, Agent, or Firm* — Schwabe, Williamson & Wyatt, P.C.

(57) ABSTRACT

Some embodiments include a method of depositing a photoresist onto a substrate in a processing chamber. In an embodiment, the method comprises flowing an oxidant into the processing chamber through a first path in a showerhead, and flowing an organometallic into the processing chamber through a second path in the showerhead. In an embodiment, the first path is isolated from the second path so that the oxidant and the organometallic do not mix within the showerhead. In an embodiment, the method further comprises that the oxidant and the organometallic react in the processing chamber to deposit the photoresist on the substrate.

18 Claims, 7 Drawing Sheets

(56) References Cited

U.S. PATENT DOCUMENTS

| | | | |
|---|---|---|---|
| 2015/0017812 A1* | 1/2015 | Chandrasekharan | ........................ C23C 16/45544 438/762 |
| 2017/0102612 A1* | 4/2017 | Meyers | ................... G03F 7/162 |
| 2020/0133131 A1 | 4/2020 | Ouyang | |

FOREIGN PATENT DOCUMENTS

| | | |
|---|---|---|
| JP | 2019500490 A | 1/2019 |
| KR | 10-1999-0051335 | 7/1999 |
| KR | 10-2014-0007565 | 1/2014 |
| WO | 2020170482 A1 | 8/2020 |

OTHER PUBLICATIONS

International Search Report and Written Opinion from Patent Application No. PCT/US2021/058317 dated Mar. 2, 2022, 13 pgs.
Notice of Reasons for Rejection from Japanese Patent Application No. 2023-529032 dated Jul. 26, 2024, 6 pgs.
Official Letter from Taiwan Patent Application No. 110142002 dated Feb. 16, 2024, 6 pgs.
Decision of Rejection from Japanese Patent Application No. 2023-529032 dated Feb. 4, 2025, 6 pgs.

* cited by examiner

PHOTORESIST DEPOSITION USING INDEPENDENT MULTICHANNEL SHOWERHEAD

CROSS-REFERENCE TO RELATED APPLICATIONS

This application claims the benefit of U.S. Provisional Application No. 63/114,940, filed on Nov. 17, 2020, the entire contents of which are hereby incorporated by reference herein.

BACKGROUND

1) Field

Embodiments of the present disclosure pertain to the field of semiconductor processing and, in particular, to processing tools for depositing photoresist onto a substrate with a vapor phase process.

2) Description of Related Art

Lithography has been used in the semiconductor industry for decades for creating 2D and 3D patterns in microelectronic devices. The lithography process involves spin-on deposition of a film (photoresist), irradiation of the film with a selected pattern by an energy source (exposure), and removal (etch) of exposed (positive tone) or non-exposed (negative tone) region of the film by dissolving in a solvent. A bake will be carried out to drive off remaining solvent.

The photoresist should be a radiation sensitive material and upon irradiation a chemical transformation occurs in the exposed part of the film which enables a change in solubility between exposed and non-exposed regions. Using this solubility change, either exposed or non-exposed regions of the photoresist are removed (etched). Now the photoresist is developed and the pattern can be transferred to the underlying thin film or substrate by etching. After the pattern is transferred, the residual photoresist is removed and repeating this process many times can give 2D and 3D structures to be used in microelectronic devices.

Several properties are important in lithography processes. Such important properties include sensitivity, resolution, lower line-edge roughness (LER), etch resistance, and ability to form thinner layers. When the sensitivity is higher, the energy required to change the solubility of the as-deposited film is lower. This enables higher efficiency in the lithographic process. Resolution and LER determine how narrow features can be achieved by the lithographic process. Higher etch resistant materials are required for pattern transferring to form deep structures. Higher etch resistant materials also enable thinner films. Thinner films increase the efficiency of the lithographic process.

SUMMARY

Embodiments of the present disclosure include methods of, and apparatuses for, depositing a photoresist on a substrate with a vapor phase process using a multi-channel showerhead.

Some embodiments include a method of depositing a photoresist onto a substrate in a processing chamber. In an embodiment, the method comprises flowing an oxidant into the processing chamber through a first path in a showerhead, and flowing an organometallic into the processing chamber through a second path in the showerhead. In an embodiment, the first path is isolated from the second path so that the oxidant and the organometallic do not mix within the showerhead. In an embodiment, the method further comprises that the oxidant and the organometallic react in the processing chamber to deposit the photoresist on the substrate.

Some embodiments include a method of depositing a metal oxo photoresist on a substrate in a processing chamber. In an embodiment, the method comprises: a) flowing an organometallic and a first inert carrier gas into the processing chamber through a first path in a showerhead, and flowing a second inert carrier gas into the processing chamber through a second path in the showerhead. In an embodiment, the first path is isolated from the second path to prevent mixing within the showerhead. The method may further comprise: b) flowing the first inert carrier gas into the processing chamber through the first path in the showerhead, and flowing the second inert carrier gas into the processing chamber through the second path in the showerhead. The method may further comprise: c) flowing an oxidant and the second inert carrier gas into the processing chamber through the second path in the showerhead, and flowing the first inert carrier gas into the processing chamber through the first path in the showerhead. The method may further comprise: d) flowing the first inert carrier gas into the processing chamber through the first path in the showerhead, and flowing the second inert carrier gas into the processing chamber through the second path in the showerhead.

Some embodiments include a processing tool for depositing a photoresist on a substrate within a chamber. In an embodiment, the processing tool comprises a pedestal for supporting the substrate, a shadow ring around a perimeter of the pedestal, and a showerhead opposite the pedestal. In an embodiment, the showerhead comprises a first fluidic path, and a second fluidic path. In an embodiment, the first fluidic path is isolated from the second fluidic path so that gasses in the first fluidic path do not mix with gasses in the second fluidic path within the showerhead.

DETAILED DESCRIPTION

Figure 1:
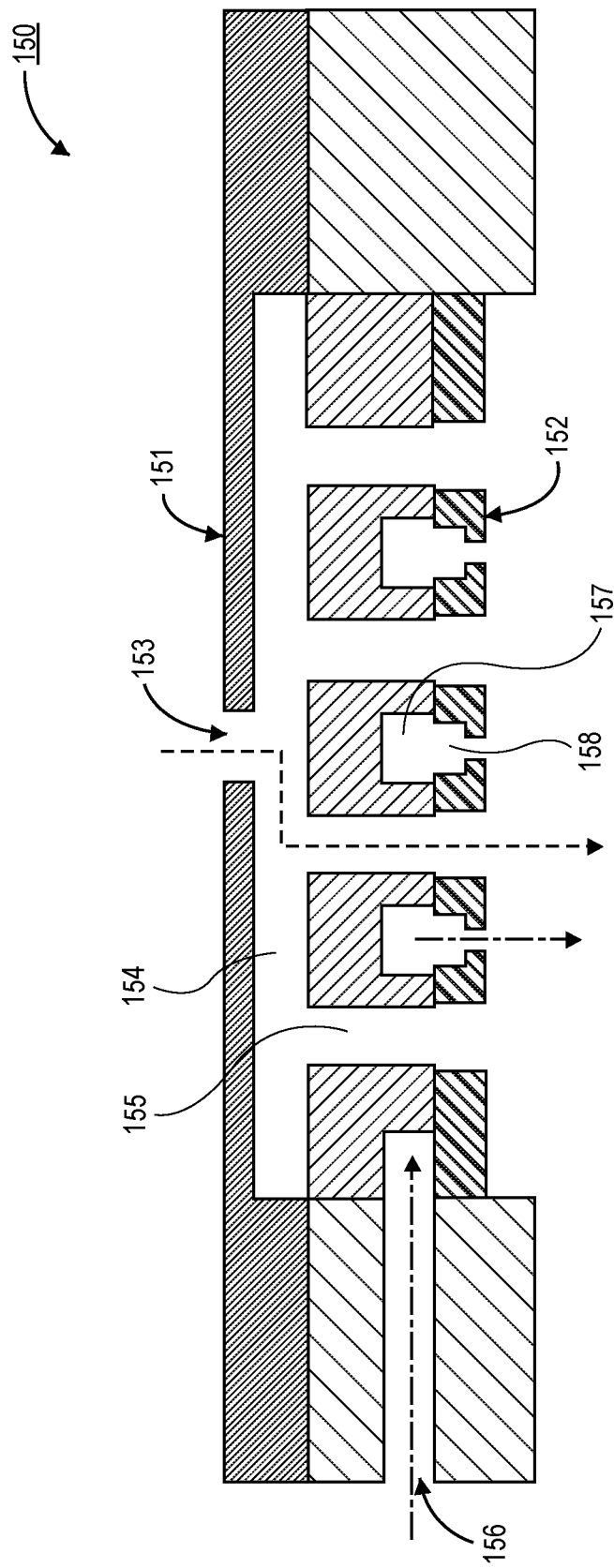
FIG. 1 is a cross-sectional illustration of a dual channel showerhead, in accordance with an embodiment.

Processing tools and methods for depositing photoresist onto a substrate with a vapor phase process, are described. In the following description, numerous specific details are set forth of processing tools for implementing the vapor phase deposition in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

To provide context, photoresist systems used in extreme ultraviolet (EUV) lithography and electron beam (E-beam) lithography suffer from low efficiency. That is, existing photoresist material systems for EUV lithography require high dosages in order to provide the needed solubility switch that allows for developing the photoresist material. Organic-inorganic hybrid materials (e.g., metal oxo materials systems) have been proposed as a material system for EUV lithography due to the increased sensitivity to EUV radiation. Such material systems typically comprise a metal (e.g., Sn, Hf, Zr, etc.), oxygen, and carbon. Metal oxo based organic-inorganic hybrid materials have also been shown to provide lower LER and higher resolution, which are required characteristics for forming narrow features.

Metal oxo material systems are currently disposed over a substrate using a wet process. The metal oxo material system is dissolved in a solvent and distributed over the substrate (e.g., a wafer) using wet chemistry deposition processes, such as a spin coating process. Wet chemistry deposition of the photoresist suffers from several drawbacks. One negative aspect of wet chemistry deposition is that a large amount of wet byproducts are generated. Wet byproducts are not desirable and the semiconductor industry is actively working to reduce wet byproducts wherever possible. Additionally, wet chemistry deposition may result in non-uniformity issues. For example, spin-on deposition may provide a photoresist layer that has a non-uniform thickness or non-uniform distribution of the metal oxo molecules. Additionally, it has been shown that metal oxo photoresist material systems suffer from thickness reduction after exposure in spin-on/wet chemistry photoresist systems, which is troublesome in lithographic processes. Furthermore, in a spin-on process, the percentage of metal in the photoresist is fixed, and cannot be easily tuned.

Accordingly, embodiments of the present disclosure provide a processing tool that enables a vacuum deposition process for providing a photoresist layer over the wafer. The vacuum deposition process addresses the shortcomings of the wet deposition process described above. Particularly, a vacuum deposition process provides the advantages of: 1) eliminating the generation of wet byproducts; 2) providing a highly uniform photoresist layer; 3) resisting thickness reduction after exposure; and 4) providing a mechanism to tune the percentage of metal in the photoresist.

Generally, vacuum deposition processes for metal oxo photoresists rely on the reaction between an organometallic and an oxidant. In a particular embodiment, the organometallic may have the general formula $MZ_4$, where M is a metal (e.g., Sn, Hf, Zr, etc.), and Z may be an organic compound. For example, Z may include an organic compound containing C and H, including, but not limited to, saturated, unsaturated, and aromatic organic groups. Z may also comprise —$NR_3$ groups, where R is H or of organic origin containing C and H, including, but not limited to, saturated, unsaturated, and aromatic organic groups. Z may also comprise —$OR_3$ groups, where R is where R is H or of organic origin containing C and H, including, but not limited to, saturated, unsaturated, and aromatic organic groups. Z may also comprise —H or —OH in some embodiments. In an embodiment, the oxidant may comprise an —OH group as the reactive end of a carbon backbone. However, it is to be appreciated that the —OH groups may be replaced with one or more of a diol (two —OH groups), an —$NH_2$ group, an —$NR_2$ group, an —OR group, an —RCOO group, a carboxylic acid, an isocyanate, or an isothiocyanate. In a particular embodiment, the oxidant vapor may comprise ethylene glycol or $H_2O$.

However, it is to be appreciated that the reaction between the organometallic and the oxidant occurs rapidly. That is, mixture of the two before entering the chamber can result in unwanted deposition of the metal oxo on surfaces within the showerhead assembly. This can lead to obstructions to the flow of the processing gasses and is undesirable. Additionally, when the reaction occurs upstream of the desired process volume, homogeneity of the film (before and after exposure) may be negatively impacted. As such, embodiments disclosed herein include a multi-channel showerhead assembly that is capable of isolating the organometallic from the oxidant until the two reach the desired process volume. For example, a dual channel showerhead may allow for the oxidant to flow through a first path through the showerhead, and allow for the organometallic to flow through a second, isolated, path through the showerhead. As such, there is no risk of a premature reaction, and the reaction will be isolated to in the desired process volume. Additionally, the exit holes from the showerhead may be engineered to minimize diffusion back into the isolated paths. For example, exit hole diameters may be relatively small so as to have a high exit velocity in order to minimize or eliminate the backflow/diffusion of gasses from the chamber into the paths through the showerhead.

In some embodiments, the processing tool may be suitable for thermal vapor deposition processes (i.e., without a plasma). Such processes may comprise chemical vapor deposition (CVD) or atomic layer deposition (ALD). Alternatively, the processing tool may include a plasma source to enable plasma enhanced operations, such as, plasma enhanced CVD (PE-CVD) or plasma enhanced ALD (PE-ALD). Furthermore, while embodiments disclosed herein are particularly suitable for the deposition of metal oxo photoresists for EUV patterning, it is to be appreciated that embodiments are not limited to such configurations. For example, the processing tools described herein may be suitable for depositing any photoresist material for any regime of lithography using a vapor phase process that can benefit from isolation of processing gasses until the gasses reach the chamber.

Referring now to FIG. 1, a cross-sectional illustration of a multi-channel showerhead 150 is shown, in accordance with an embodiment. In an embodiment, the multi-channel showerhead 150 may comprise two or more fluidic paths. In the illustrated embodiment, a pair of fluidic paths are shown. However, it is to be appreciated that three or more fluidic paths may be used when more than two processing gasses need to be separated until they reach the processing chamber.

The showerhead 150 comprises an upstream surface 151 and a downstream surface 152. In an embodiment, a first inlet 153 is provided to the upstream surface 151. The inlet is fluidically coupled to a first plenum 154. First openings 155 through the showerhead 150 fluidically couple the first plenum 154 to the downstream surface 152 of the showerhead 150. That is, a first fluidic path comprises the inlet 153, the first plenum 154, and the first openings 155.

In an embodiment, a second inlet 156 is provided through a side of the showerhead 150. The second inlet 156 is fluidically coupled to a second plenum 157. In the illustrated embodiment, the second plenum 157 is provided below the first plenum. The second inlet 156 may be fluidically coupled to the second plenum 157 out of the plane of FIG. 1. For example, the second plenum 157 may wrap around the first openings 155 out of the plane of FIG. 1 in order to provide a single volume. In an embodiment, the second plenum 157 is fluidically coupled to the downstream surface 152 of the showerhead 150 by second openings 158. That is, a second fluidic path through the showerhead 150 comprises the second inlet 156, the second plenum 157, and the second openings 158.

As shown in FIG. 1, the first fluidic path and the second fluidic path are fluidically isolated from each other. For example, a first gas flowing in the first fluidic path will not mix (within the showerhead) with a second gas flowing in the second fluidic path. As such, the first gas and the second gas can be fluidically isolated from each other until reaching a processing chamber (not shown) at the downstream surface 152 of the showerhead 150. This is particularly beneficial for metal oxo photoresist deposition processes where the oxidant vapor and the organometallic vapor are highly reactive with each other.

In the illustrated embodiment, the first inlet 153 is provided on the upstream surface 151 of the showerhead 150, and the second inlet 156 is provided along a side wall surface of the showerhead 150. However, it is to be appreciated that both the first inlet 153 and the second inlet 156 may both be provided on the upstream surface 151, so long as the fluidic paths remain fluidically isolated. Similarly, both the first inlet 153 and the second inlet 156 may be provided along sidewall surfaces of the showerhead 150 in some embodiments, so long as the fluidic paths remain fluidically isolated.

Embodiments disclosed herein include depositing a metal oxo photoresist on a substrate with a vapor phase process using a showerhead with multiple, isolated, fluidic paths in order to keep the oxidant separate from the organometallic until the gasses reach the processing chamber. The vapor phase process may be implemented with or without plasma assistance. For example, the vapor phase process may be a CVD process, an ALD process, a PE-CVD process, or a PE-ALD process. Examples of various vapor phase processing embodiments are provided in FIGS. 2-5.

In FIGS. 2-5 the vapor phase processes may be implemented with a chamber pressure between approximately 0.01 Torr and approximately 100 Torr. A substrate temperature may be between approximately 25° C. and approximately 400°. A distance between the substrate and the showerhead may be between approximately 0.5 mm and approximately 300 mm, with a showerhead temperature between approximately 25° C. and approximately 400°.

In an embodiment, the vapor phase processes in FIGS. 2-5 may be implemented using a showerhead similar to the showerhead 150 described above. That is, the showerhead may include a first fluid path that is isolated from a second fluid path. As such, an oxidant and an organometallic may be flown into the chamber while being isolated from each other until entering the processing chamber.

Figure 2:
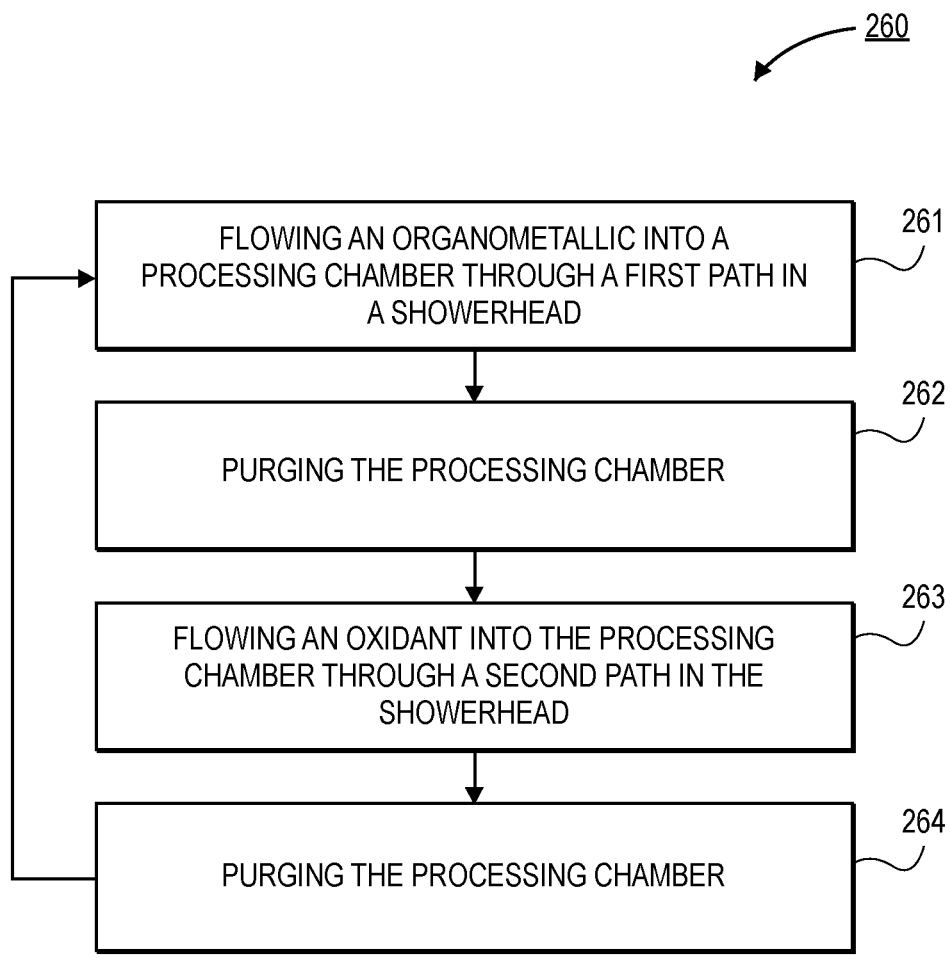
FIG. 2 is a process flow diagram of a process for depositing a photoresist on a substrate using a multi-channel showerhead to separate an oxidant from an organometallic, where the oxidant and the organometallic are flown into the chamber at different times, in accordance with an embodiment.

Referring now to FIG. 2, a process flow 260 for depositing a photoresist on a substrate in a chamber is shown, in accordance with an embodiment. In an embodiment, process flow 260 may begin with operation 261, which comprises flowing an organometallic into a processing chamber through a first path in a showerhead. In an embodiment, the organometallic may be flown into the chamber with an inert carrier gas, such as Ar and/or $N_2$. For example, the inert carrier gas may have a flowrate between approximately 0.1 slm and approximately 20 slm, and the organometallic may have a flow rate between approximately 0.01 grams/minute and approximately 4.0 grams/minute. In an embodiment, two or more different organometallic precursors may be flown through the first path in the showerhead. In an embodiment, an organotin and an organohafnium may be flown through the first path in the showerhead. In an embodiment, an inert gas (e.g., Ar and/or $N_2$) may be flown through the second fluid path of the showerhead during operation 261. For example, a flowrate of the inert gas in the second fluid path may be between approximately 0.1 slm and approximately 20 slm. Operation 261 may be implemented for a first duration of time. For example, the first duration of time may be between approximately 0 seconds and approximately 60 seconds.

Process 260 may continue with operation 262 which comprises purging the processing chamber. In an embodiment, the purging operation 262 may include flowing inert gas (e.g., Ar and/or $N_2$) through the first fluid path and the second fluid path. The purge flowrates in the first fluid path and the second fluid path may be between approximately 0.1 slm and approximately 20 slm. In an embodiment, the operation 262 may have a second duration. For example, the second duration may be between approximately 0 seconds and approximately 60 seconds. However, in some embodiments, the operation 262 may be omitted. That is, process 260 may progress from operation 261 directly to operation 262.

Process 260 may continue with operation 263 which comprises flowing an oxidant into the processing chamber through the second path in the showerhead. In an embodiment, the oxidant may be flown into the chamber with an inert carrier gas, such as Ar and/or $N_2$. For example, the inert carrier gas may have a flowrate between approximately 0.1 slm and approximately 20 slm, and the oxidant may have a flow rate between approximately 0.01 grams/minute and approximately 4.0 grams/minute. In an embodiment, two or more different oxidants may be flown through the second path in the showerhead. For example, $H_2O$ and an alcohol may be flown through the second path in the showerhead. In an embodiment, an inert gas (e.g., Ar and/or $N_2$) may be flown through the first fluid path of the showerhead during operation 263. For example, a flowrate of the inert gas in the first fluid path may be between approximately 0.1 slm and approximately 20 slm. Operation 263 may be implemented for a third duration of time. For example, the third duration of time may be between approximately 0 seconds and approximately 60 seconds.

Process 260 may continue with operation 264 which comprises purging the processing chamber. In an embodiment, the purging operation 264 may include flowing inert gas (e.g., Ar and/or $N_2$) through the first fluid path and the second fluid path. The purge flowrates in the first fluid path and the second fluid path may be between approximately 0.1 slm and approximately 20 slm. In an embodiment, the operation 263 may have a fourth duration. For example, the fourth duration may be between approximately 0 seconds and approximately 60 seconds. However, in some embodiments, the operation 264 may be omitted. That is, process 260 may progress from operation 263 directly to operation 261. In an embodiment, the processing operations 261-264 may be repeated any number times in order to deposit a photoresist of a desired thickness on the substrate in the processing chamber.

Figure 3:
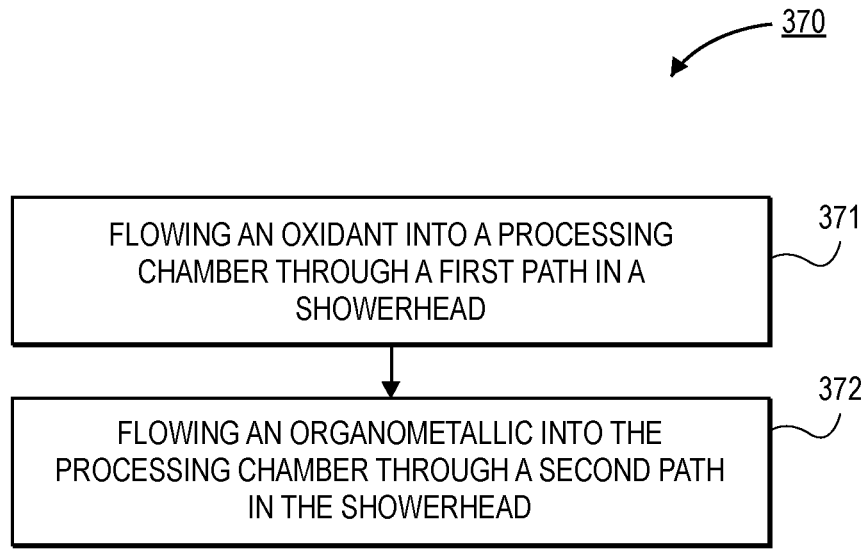
FIG. 3 is a process flow diagram of a process for depositing a photoresist on a substrate using a multi-channel showerhead to separate an oxidant from an organometallic, where the oxidant and the organometallic are flown into the chamber at the same time, in accordance with an embodiment.

Referring now to FIG. 3, a process flow 370 depicting a process for depositing a photoresist on a substrate in a processing chamber is shown, in accordance with an embodiment. In an embodiment, process flow 370 begins with operation 371 and operation 372. In an embodiment, operation 371 and operation 372 may be implemented at the same time.

In an embodiment, operation 371 may include flowing an oxidant into a processing chamber through a first path in a showerhead. The oxidant may be flown into the processing chamber with an inert carrier gas (e.g., Ar and/or $N_2$). For example, the inert carrier gas may have a flowrate between approximately 0.1 slm and approximately 20 slm, and the oxidant may have a flow rate between approximately 0.01 grams/minute and approximately 4.0 grams/minute. In an embodiment, two or more different oxidants may be flown through the first path in the showerhead. For example, $H_2O$ and an alcohol may be flown through the first path in the showerhead.

In an embodiment, operation 372 may include flowing an organometallic into the processing chamber through a second path in the showerhead. The organometallic may be flown into the processing chamber with an inert carrier gas (e.g., Ar and/or $N_2$). For example, the inert carrier gas may have a flowrate between approximately 0.1 slm and approximately 20 slm, and the organometallic may have a flow rate between approximately 0.01 grams/minute and approximately 4.0 grams/minute. In an embodiment, two or more different organometallic precursors may be flown through the second path in the showerhead. In an embodiment, an organotin and an organohafnium may be flown through the second path in the showerhead.

Despite being flown into the processing chamber at the same time, it is to be appreciated that the organometallic and the oxidant do not mix until reaching the chamber. This is due to the first path in the showerhead being fluidically isolated from the second path in the showerhead. As such, there is no premature reaction of the organometallic and the oxidant.

In an embodiment, operations 371 and 372 may be implemented for first duration. The first duration may be chosen in order to allow for a photoresist to be deposited on the substrate with a desired thickness. For example, the first duration may be between approximately 0 seconds and approximately 10 minutes.

Figure 4:
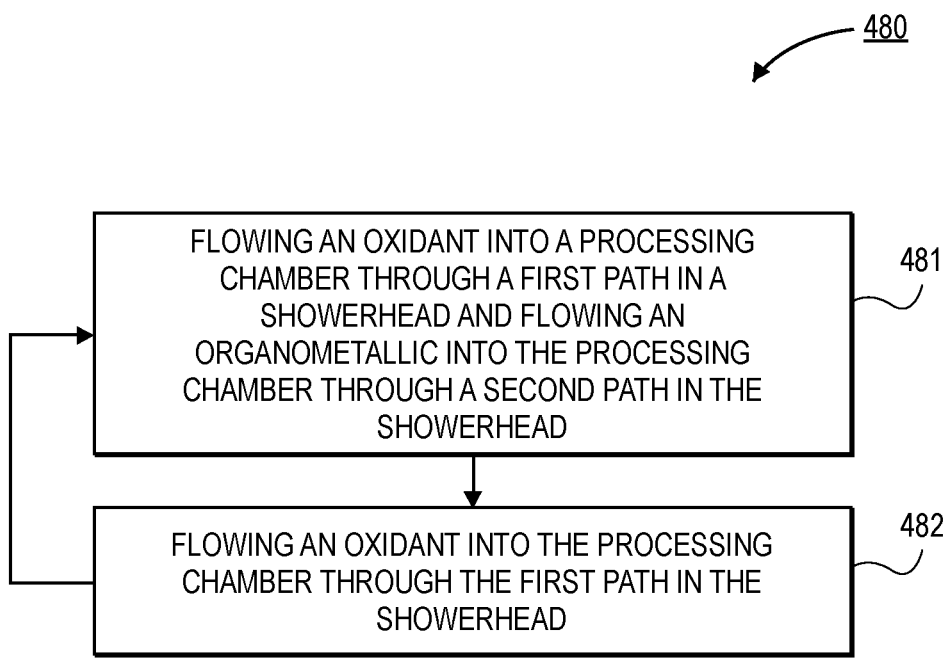
FIG. 4 is a process flow diagram of a process for depositing a photoresist on a substrate using a multi-channel showerhead to separate an oxidant from an organometallic, where the oxidant is continuously flown into the chamber and the organometallic is not continuously flown into the chamber, in accordance with an embodiment.

Referring now to FIG. 4, a process flow 480 depicting a process for depositing a photoresist on a substrate in a processing chamber is shown, in accordance with an embodiment. Process 480 may begin with operation 481 which comprises flowing an oxidant into a processing chamber through a first path in a showerhead, and flowing an organometallic into the processing chamber through a second path in the showerhead. In an embodiment, the first path and the second path are fluidically isolated in order to prevent mixing of the oxidant and the organometallic until they reach the processing chamber. In an embodiment, two or more different oxidants may be flown through the first path in the showerhead. For example, $H_2O$ and an alcohol may be flown through the first path in the showerhead. In an embodiment, two or more different organometallic precursors may be flown through the second path in the showerhead. In an embodiment, an organotin and an organohafnium may be flown through the second path in the showerhead.

In an embodiment, the oxidant and the organometallic may be flown into the chamber with an inert carrier gas, such as Ar and/or $N_2$. For example, the inert carrier gases may have a flowrate between approximately 0.1 slm and approximately 20 slm, and the organometallic and the oxidant may have flow rates between approximately 0.01 grams/minute and approximately 4.0 grams/minute. In an embodiment, operation 481 may be implemented for a first duration of time. In an embodiment, the first duration of time may be between approximately 0 seconds and approximately 60 seconds.

In an embodiment, process 480 continues with operation 482, which comprises flowing an oxidant into the processing chamber through the first path in the showerhead. During operation 482, the flow of the organometallic into the chamber is halted. Though, it is to be appreciated that an inert gas (e.g., Ar and/or $N_2$) may be flown into the chamber through the second path. In an embodiment, the operation 482 may be implemented for a second duration. For example, the second duration may be between approximately 0 seconds and approximately 60 seconds. The flow characteristics of the oxidant in operation 482 may be substantially similar to the flow characteristics of the oxidant in operation 481.

In an embodiment, process 480 may then continue with repeating operations 481 and 482 any number of times in order to provide a photoresist with a desired thickness. In an embodiment, repeating operations 481 and 482 may result in the oxidant being continuously flown into the chamber, while the flow of the organometallic is pulsed on and off.

Figure 5:
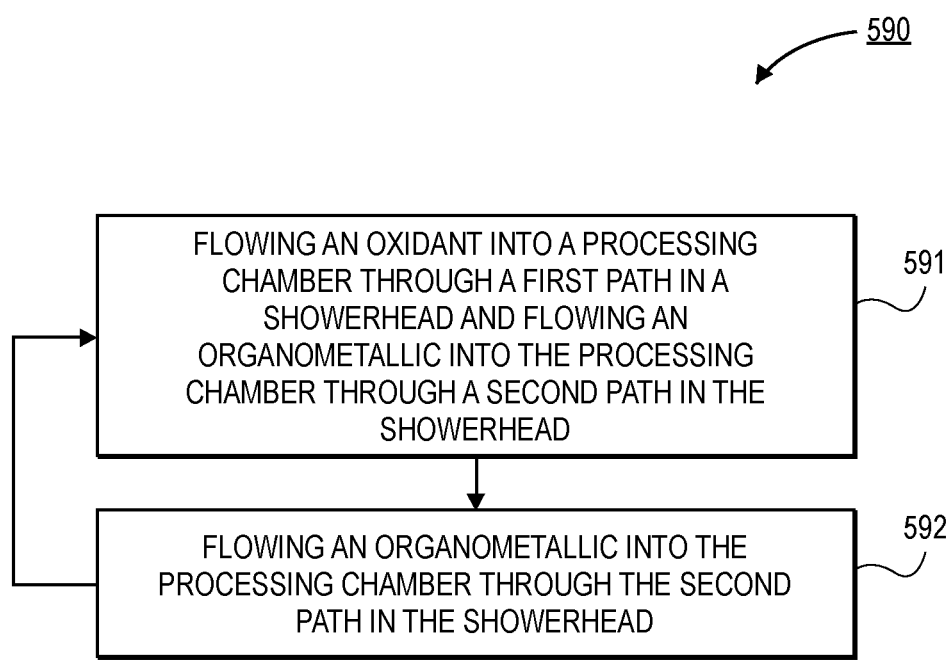
FIG. 5 is a process flow diagram of a process for depositing a photoresist on a substrate using a multi-channel showerhead to separate an oxidant from an organometallic, where the organometallic is continuously flown into the chamber and the oxidant is not continuously flown into the chamber, in accordance with an embodiment.

Referring now to FIG. 5, a process flow 590 depicting a process for depositing a photoresist on a substrate in a processing chamber is shown, in accordance with an embodiment. Process 590 may begin with operation 591 which comprises flowing an oxidant into a processing chamber through a first path in a showerhead, and flowing an organometallic into the processing chamber through a second path in the showerhead. In an embodiment, the first path and the second path are fluidically isolated in order to prevent mixing of the oxidant and the organometallic until they reach the processing chamber. In an embodiment, two or more different oxidants may be flown through the first path in the showerhead. For example, $H_2O$ and an alcohol may be flown through the first path in the showerhead. In an embodiment, two or more different organometallic precursors may be flown through the second path in the showerhead. In an embodiment, an organotin and an organohafnium may be flown through the second path in the showerhead.

In an embodiment, the oxidant and the organometallic may be flown into the chamber with an inert carrier gas, such as Ar and/or $N_2$. For example, the inert carrier gases may have a flowrate between approximately 0.1 slm and approximately 20 slm, and the organometallic and the oxidant may have flow rates between approximately 0.01 grams/minute and approximately 4.0 grams/minute. In an embodiment, operation 481 may be implemented for a first duration of time. In an embodiment, the first duration of time may be between approximately 0 seconds and approximately 60 seconds.

In an embodiment, process 590 continues with operation 592, which comprises flowing an organometallic into the processing chamber through the second path in the showerhead. During operation 592, the flow of the oxidant into the chamber is halted. Though, it is to be appreciated that an inert gas (e.g., Ar and/or $N_2$) may be flown into the chamber through the first path. In an embodiment, the operation 592 may be implemented for a second duration. For example, the second duration may be between approximately 0 seconds and approximately 60 seconds. The flow characteristics of the organometallic in operation 592 may be substantially similar to the flow characteristics of the organometallic in operation 591.

In an embodiment, process 590 may then continue with repeating operations 591 and 592 any number of times in order to provide a photoresist with a desired thickness. In an embodiment, repeating operations 591 and 592 may result in the organometallic being continuously flown into the chamber, while the flow of the oxidant is pulsed on and off.

In an embodiment, the process flows in FIGS. 2-5 may be implemented with any processing tool that comprises a multi-channel showerhead. One example of such a processing tool is provided in FIG. 6.

Figure 6:
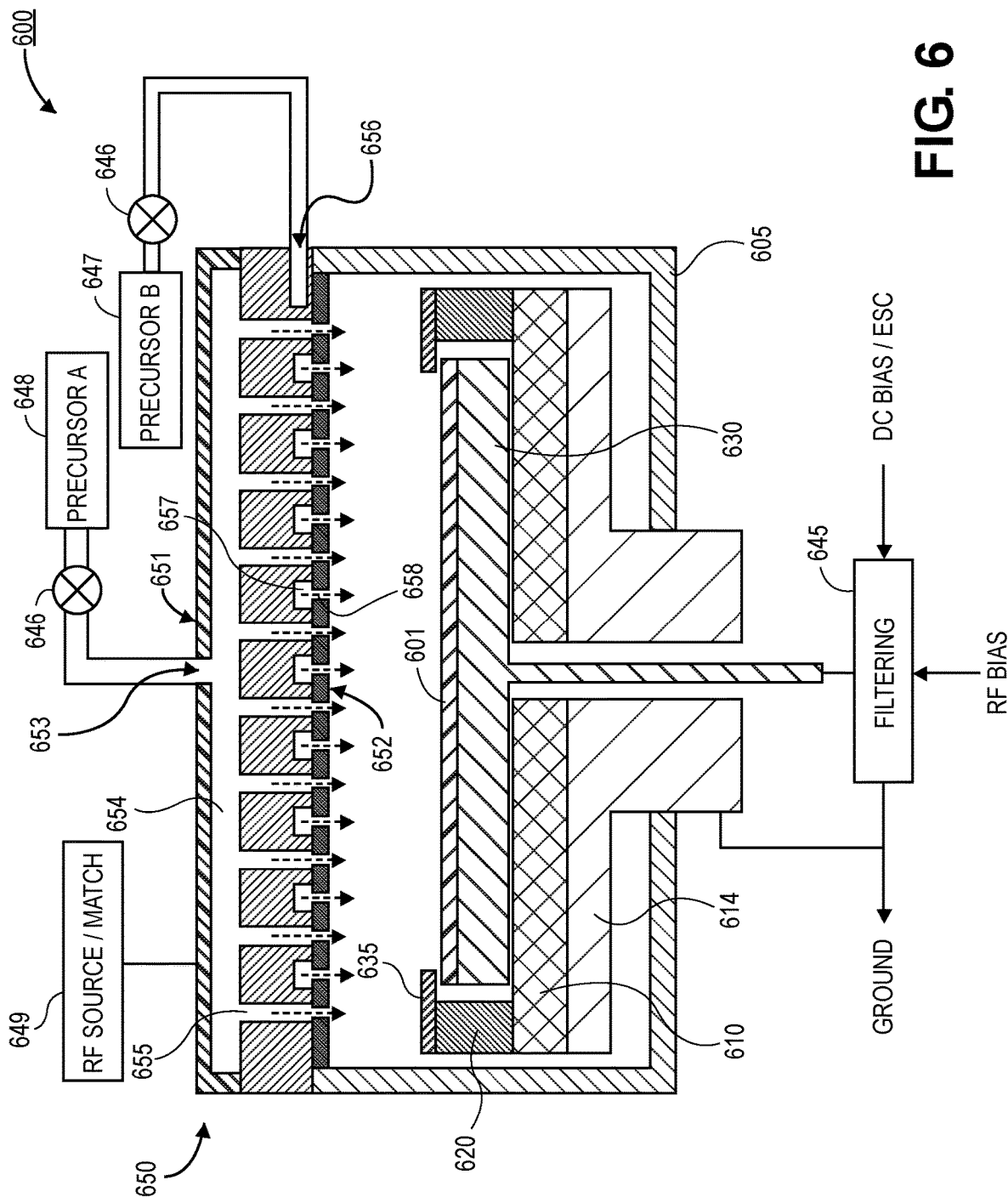
FIG. 6 is a cross-sectional illustration of a process tool used to deposit a photoresist onto a substrate, in accordance with an embodiment.

Referring now to FIG. 6, a cross-sectional illustration of a processing tool 600 is shown, in accordance with an embodiment. In an embodiment, the processing tool 600 may comprise a chamber 605. The chamber 605 may be any suitable chamber capable of supporting a sub-atmospheric pressure (e.g., a vacuum pressure). In an embodiment, an exhaust (not shown) that includes a vacuum pump may be coupled to the chamber 605 to provide a sub-atmospheric pressure. In an embodiment, a showerhead 650 may seal the chamber 605.

In an embodiment, the showerhead 650 may include a first fluidic path and a second fluidic path to enable processing gasses and/or inert gasses to be flown into the chamber 605. The first fluidic path comprises an inlet 653 at an upstream surface 651 of the showerhead 650. The inlet 653 feeds a first plenum 654, and the first plenum 654 is fluidically coupled to the downstream surface 652 of the showerhead 650 by first openings 655. The second fluidic path comprises an inlet 656 at a sidewall surface of the showerhead 650. The inlet 656 feeds a second plenum 657, and the second plenum 657 is fluidically coupled to the downstream surface 652 of the showerhead 650 by second openings 658.

In an embodiment, the inlet 653 is fed precursor A 648 through a valve 646, and the inlet 656 is fed precursor B 647 through a valve 646. In an embodiment, precursor A 648 may be an oxidant, and precursor B may be an organometallic. Due to the fluidically isolated first fluid path and second fluid path, the oxidant and the organometallic do not mix until they reach the interior volume of the chamber 605.

In some embodiments where the processing tool 600 is suitable for plasma enhanced operation, the showerhead 650 may be electrically coupled to an RF source and matching circuitry 649. In yet another embodiment, the tool 600 may be configured in an RF bottom fed architecture. That is, the pedestal 630 is connected to an RF source, and the showerhead 650 is grounded. In such an embodiment, filtering circuitry may be connected to the pedestal 630.

In an embodiment, a displaceable column for supporting a wafer 601 is provided in the chamber 605. In an embodiment, the wafer 601 may be any substrate on which a photoresist material is deposited. For example, the wafer 601 may be a 300 mm wafer or a 450 mm wafer, though other wafer diameters may also be used. Additionally, the wafer 601 may be replaced with a substrate that has a non-circular shape in some embodiments. The displaceable column may include a pillar 614 that extends out of the chamber 605. The pillar 614 may have a port to provide electrical and fluidic paths to various components of the column from outside the chamber 605.

In an embodiment, the column may comprise a baseplate 610. The baseplate 610 may be grounded. As will be described in greater detail below, the baseplate 610 may comprise fluidic channels to allow for the flow of an inert gas to provide an edge purge flow. In an embodiment, the pedestal 630 may utilize any suitable chucking system to secure the wafer 601. For example, the pedestal 630 may be a vacuum chuck or a monopolar chuck. In embodiments where a plasma is not generated in the chamber 605, the pedestal 630 may utilize a bipolar chucking architecture.

The pedestal 630 may comprise a plurality of cooling channels (not shown). The cooling channels may be connected to a fluid input and a fluid output (not shown) that pass through the pillar 614. In an embodiment, the cooling channels allow for the temperature of the wafer 601 to be controlled during operation of the processing tool 600. For example, the cooling channels may allow for the temperature of the wafer 601 to be controlled to between approximately −40° C. and approximately 300° C. In an embodiment, the pedestal 630 connects to the ground through filtering circuitry 645, which enables DC and/or RF biasing of the pedestal with respect to the ground.

In an embodiment, an edge ring 620 surrounds a perimeter of the pedestal 630. The edge ring 620 may be a dielectric material, such as a ceramic. In an embodiment, the edge ring 620 is supported by the baseplate 610. The edge ring 620 may support a shadow ring 635. The shadow ring 635 has an interior diameter that is smaller than a diameter of the wafer 601. As such, the shadow ring 635 blocks the photoresist from being deposited onto a portion of the outer edge of the wafer 601. A gap is provided between the shadow ring 635 and the wafer 601. The gap prevents the shadow ring 635 from contacting the wafer 601, and provides an outlet for the edge purge flow that will be described in greater detail below.

While the shadow ring 635 provides some protection of the top surface and edge of the wafer 601, processing gasses may flow/diffuse down along a path between the edge ring 620 and the wafer 601. As such, embodiments disclosed herein may include an fluidic path between the edge ring 620 and the pedestal 630 to enable an edge purge flow. Providing an inert gas in the fluidic path increases the local pressure in the fluidic path and prevents processing gasses from reaching the edge of the wafer 601. Therefore, deposition of the photoresist is prevented along the edge of the wafer 601.

Figure 7:
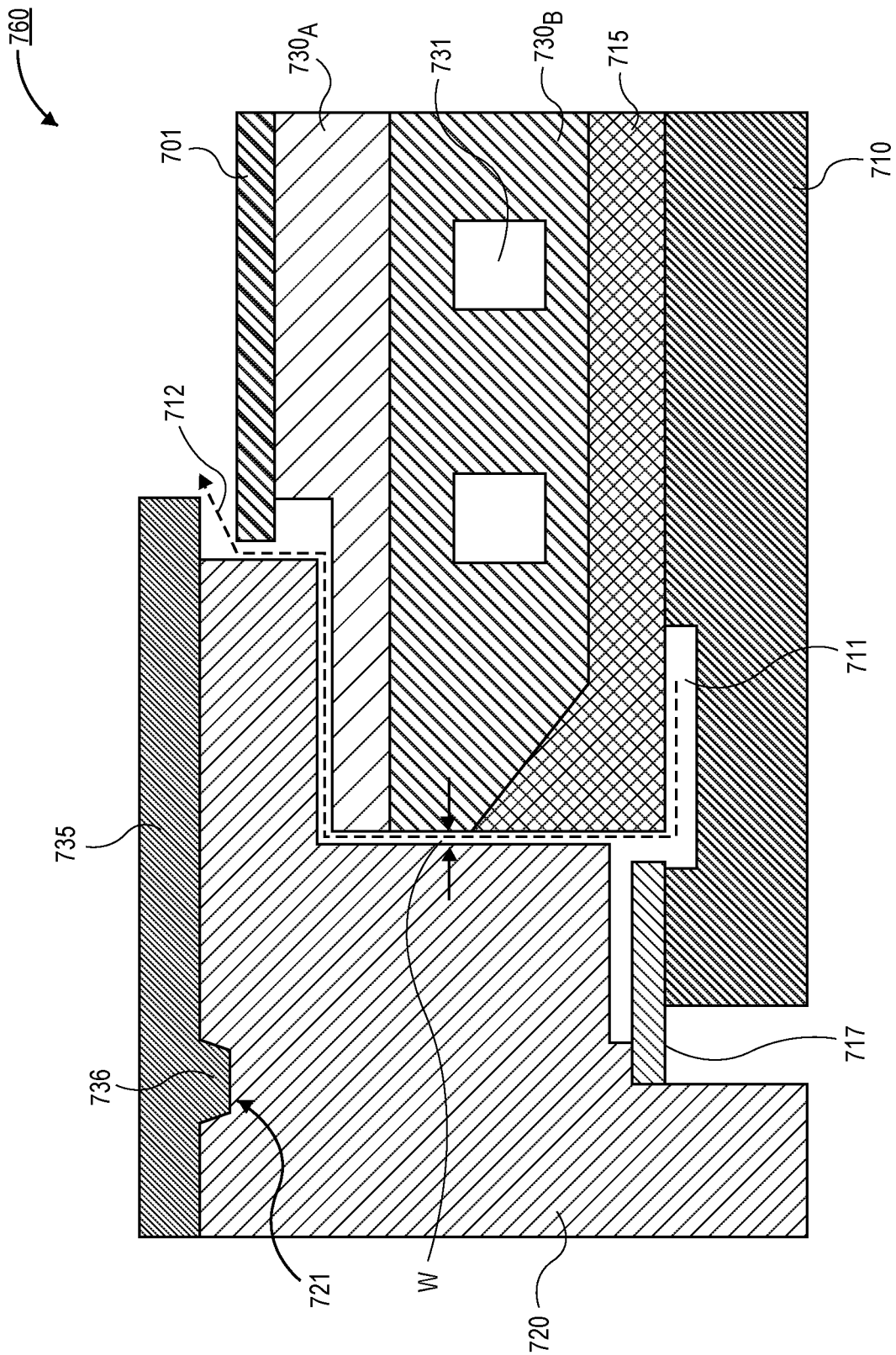
FIG. 7 is a zoomed in illustration of an edge of a displaceable column in a processing tool for depositing a photoresist layer over a substrate with a vapor phase process, in accordance with an embodiment of the present disclosure.

Referring now to FIG. 7, a zoomed in cross-sectional illustration of a portion of a column 760 within a processing tool is shown, in accordance with an embodiment. In FIG. 7, only the left edge of the column 760 is shown. However, it is to be appreciated that the right edge of the column 760 may substantially mirror the left edge.

In an embodiment, the column 760 may comprise a baseplate 710. An insulating layer 715 may be disposed over the baseplate 710. In an embodiment, the pedestal 730 may comprise a first portion $730_A$ and a second portion $730_B$. The cooling channels 731 may be disposed in the second portion 730$_B$. The first portion 730$_A$ may include features for chucking the wafer 701.

In an embodiment, an edge ring 720 surrounds the baseplate 710, the insulating layer 715, the pedestal 730, and the wafer 701. In an embodiment, the edge ring 720 is spaced away from the other components of the column 760 to provide a fluidic path 712 from the baseplate 710 to the topside of the column 760. For example, the fluidic path 712 may exit the column between the wafer 701 and shadow ring 735. In a particular embodiment, an interior surface of the fluidic path 712 comprises an edge of the insulating layer 715, an edge of the pedestal 730 (i.e., the first portion 730$_A$ and the second portion 730$_B$), and an edge of the wafer 701. In an embodiment, the outer surface of the fluidic path 712 comprises an interior edge of the edge ring 720. In an embodiment, the fluidic path 712 may also continue over a top surface of a portion of the pedestal 730 as it progresses to the edge of the wafer 701. As such, when an inert gas (e.g., helium, argon, etc.) is flown through the fluidic path 712, processing gasses are prevented from flowing/diffusing down the side of the wafer 701.

In an embodiment, the width W of the fluidic path 712 is minimized in order to prevent the striking of a plasma along the fluidic path 712. For example, the width W of the fluidic path 712 may be approximately 1 mm or less. In an embodiment, a seal 717 blocks the fluidic path 712 from exiting the bottom of the column 760. The seal 717 may be positioned between the edge ring 720 and the baseplate 710. The seal 717 may be a flexible material, such as a gasket material or the like. In a particular embodiment, the seal 717 comprises silicone.

In an embodiment, a channel 711 is disposed in the baseplate 710. The channel 711 routes an inert gas from the center of the column 760 to the interior edge of the edge ring 720. It is to be appreciated that only a portion of the channel 711 is illustrated in FIG. 7.

In an embodiment, the edge ring 720 and the shadow ring 735 may have features suitable for aligning the shadow ring 735 with respect to the wafer 701. For example, a notch 721 in the top surface of the edge ring 720 may interface with a protrusion 736 on the bottom surface of the shadow ring 735. The notch 721 and protrusion 736 may have tapered surfaces to allow for coarse alignment of the two components to be sufficient to provide a more precise alignment as the edge ring 720 is brought into contact with the shadow ring 735. In an additional embodiment, an alignment feature (not shown) may also be provided between the pedestal 730 and the edge ring 720. The alignment feature between the pedestal 730 and the edge ring 720 may comprise a tapered notch and protrusion architecture similar to the alignment feature between the edge ring 720 and the shadow ring 735.

Figure 8:
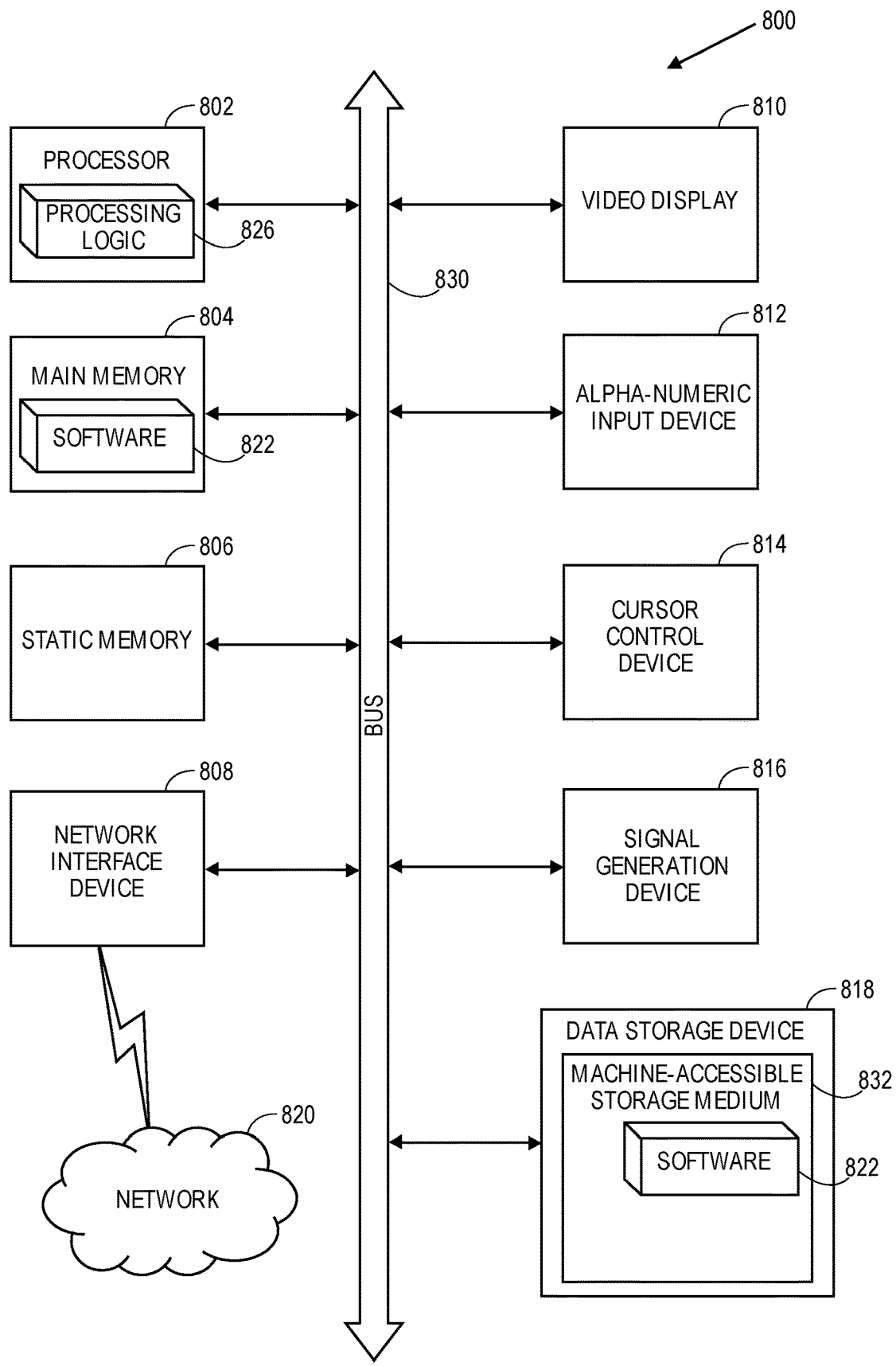
FIG. 8 illustrates a block diagram of an exemplary computer system, in accordance with an embodiment of the present disclosure.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), MRAM, etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 832 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of depositing a photoresist on a wafer. In an embodiment, the method comprises loading a wafer onto a pedestal through a slit valve in a chamber. The pedestal is then raised vertically. Raising the pedestal results in a shadow ring engaging an edge ring surrounding the pedestal. A photoresist may then be deposited on the wafer with a vapor phase process. During the photoresist deposition, an edge purge flow is provided around a perimeter of the wafer to prevent deposition of the photoresist on the edge or backside of the wafer.

Thus, methods of photoresist deposition using a vapor phase process with a tool that includes a shadow ring and an edge purge flow have been disclosed.

What is claimed is:

1. A method of depositing a photoresist onto a substrate in a processing chamber, comprising:
    flowing an oxidant into the processing chamber through a first path in a showerhead; and
    flowing an organometallic into the processing chamber through a second path in the showerhead, wherein the first path is isolated from the second path so that the oxidant and the organometallic do not mix within the showerhead, and wherein one of the first path or the second path is along an upstream surface of the showerhead, and the other one of first path or the second path is along a sidewall surface of the showerhead; and
    wherein the oxidant and the organometallic react in the processing chamber to deposit the photoresist on the substrate.

2. The method of claim 1, wherein the oxidant and the organometallic are flown into the processing chamber at the same time.

3. The method of claim 2, further comprising:
    stopping a flow of the organometallic into the processing chamber after a first period of time, wherein the oxidant continues to flow into the processing chamber after the first period of time.

4. The method of claim 3, wherein the first period of time is between approximately 0 seconds and approximately 60 seconds.

5. The method of claim 3, further comprising:
    restarting the flow of the organometallic into the processing chamber after a second period of time so that both the oxidant and the organometallic are flown into the processing chamber, wherein the second period of time is between approximately 0 seconds and approximately 60 seconds.

6. The method of claim 2, further comprising:
    stopping a flow of the oxidant into the processing chamber after a first period of time, wherein the organometallic continues to flow into the processing chamber after the first period of time.

7. The method of claim 6, wherein the first period of time is between approximately 0 seconds and approximately 60 seconds.

8. The method of claim 6, further comprising:
    restarting the flow of the oxidant into the processing chamber after a second period of time so that both the oxidant and the organometallic are flown into the processing chamber, wherein the second period of time is between approximately 0 seconds and approximately 60 seconds.

9. The method of claim 1, wherein flowing the organometallic is alternated with flowing the oxidant.

10. The method of claim 9, further comprising:
    a purge of the processing chamber between iterations of flowing the organometallic and flowing the oxidant.

11. The method of claim 1, further comprising:
    flowing a first inert carrier gas along with the oxidant through the first path in the showerhead; and
    flowing a second inert carrier gas along with the organometallic through the second path in the showerhead.

12. The method of claim 11, wherein flowrates of the first inert carrier gas and the second inert carrier gas are between approximately 0.1 slm and approximately 20 slm, and wherein flowrates of the oxidant and the organometallic are between approximately 0.01 grams/minute and approximately 4 grams/minute.

13. The method of claim 1, wherein the oxidant comprises two or more different oxidants, and/or wherein the organometallic comprises two or more different organometallics.

14. The method of claim 1, wherein the organometallic comprises an organotin, and wherein the oxidant comprises $H_2O$.

15. The method of claim 1, wherein the deposition of the photoresist is characterized as a chemical vapor deposition (CVD) process, an atomic layer deposition (ALD) process, a plasma enhanced CVD (PE-CVD) process, or a plasma enhanced ALD (PE-ALD) process.

16. A method of depositing a metal oxo photoresist on a substrate in a processing chamber, comprising:
    a) flowing an organometallic and a first inert carrier gas into the processing chamber through a first path in a showerhead, and flowing a second inert carrier gas into the processing chamber through a second path in the showerhead, wherein the first path is isolated from the second path to prevent mixing within the showerhead, and wherein one of the first path or the second path is along an upstream surface of the showerhead, and the other one of first path or the second path is along a sidewall surface of the showerhead;
    b) flowing the first inert carrier gas into the processing chamber through the first path in the showerhead, and flowing the second inert carrier gas into the processing chamber through the second path in the showerhead;
    c) flowing an oxidant and the second inert carrier gas into the processing chamber through the second path in the showerhead, and flowing the first inert carrier gas into the processing chamber through the first path in the showerhead; and
    d) flowing the first inert carrier gas into the processing chamber through the first path in the showerhead, and flowing the second inert carrier gas into the processing chamber through the second path in the showerhead.

17. The method of claim 16, further comprising:
    e) repeating the processes in operations a) through d) a plurality of times.

18. The method of claim 16, wherein the organometallic comprises an organotin, and wherein the oxidant comprises $H_2O$.

* * * * *